United States Patent [19]

Ushida

[11] 4,370,626

[45] Jan. 25, 1983

[54] OUTPUT COUPLING CIRCUIT FOR LC LOCAL OSCILLATOR

[75] Inventor: Susumu Ushida, Soma, Japan

[73] Assignee: Alps Electric Co. Ltd., Tokyo, Japan

[21] Appl. No.: 175,953

[22] Filed: Aug. 7, 1980

[30] Foreign Application Priority Data

Aug. 8, 1979 [JP] Japan .................. 54-109059[U]

[51] Int. Cl.³ .................. H03B 5/12; H03B 5/18
[52] U.S. Cl. .................. 331/96; 331/77; 331/117 D
[58] Field of Search ........ 331/117 R, 117 FE, 117 D, 331/177 V, 96, 101, 77; 455/262, 318, 319, 320; 334/41-45

[56] References Cited

U.S. PATENT DOCUMENTS

| | | | |
|---|---|---|---|
| 2,798,158 | 7/1957 | Horowitz | 331/77 |
| 3,538,466 | 11/1970 | Brand | 334/43 |
| 3,628,152 | 12/1971 | Carlson | 331/117 D X |
| 3,679,990 | 7/1972 | Hiday et al. | 331/117 D X |
| 3,855,550 | 12/1974 | Carlson | 331/117 D X |

Primary Examiner—Siegfried H. Grimm
Attorney, Agent, or Firm—Guy W. Shoup; Gerard F. Dunne

[57] ABSTRACT

A local oscillator circuit includes an inner conductor to which a pick up coil is inductively coupled. The pickup coil is further connected with a capacitor to form a resonance circuit. The resonance frequency of the resonance circuit is set higher than those frequencies in the frequency band of the local oscillator so as to pick up oscillation signals into steady level over the frequency band.

2 Claims, 3 Drawing Figures

OUTPUT COUPLING CIRCUIT FOR LC LOCAL OSCILLATOR

BACKGROUND OF THE INVENTION

The present invention relates to local oscillator circuits and, more particularly, to local oscillator circuits suitable for processing frequencies of the order of about 400–700 MHz.

The oscillation energy of a local oscillator circuit is often received by a pickup coil inductively coupled to an inner conductor of the oscillator circuit, and then amplified by an amplifier in the subsequent stage. However, the output level of the pickup coil may be lowered as the oscillation frequency grows higher. Such a phenomenon typically depends on the frequency characteristic of the active element, which typically is a transistor, of the local oscillator circuit. When such lowered oscillation signals are introduced in a subsequent stage, such as a mixer in a tuner for example, the frequency-conversion gain of the mixer will not be steady.

SUMMARY OF THE INVENTION

The principal object of the present invention is to provide a local oscillator circuit which can output steady oscillation signals even for higher frequencies.

Another object of the present invention is to provide a local oscillator including a simple circuit for picking up the oscillation energy.

A further object of the present invention is to provide a means whereby the conventional local oscillator circuit may be made to have improved frequency response quite easily.

These and other objects of the present invention are obtained by connecting a capacitor to the pickup coil in such a manner that portions of the pickup coil and this capacitor will resonate at higher frequencies.

BRIEF DESCRIPTIONS OF THE DRAWINGS

PREFERRED EMBODIMENT OF THE INVENTION

Figure 1:
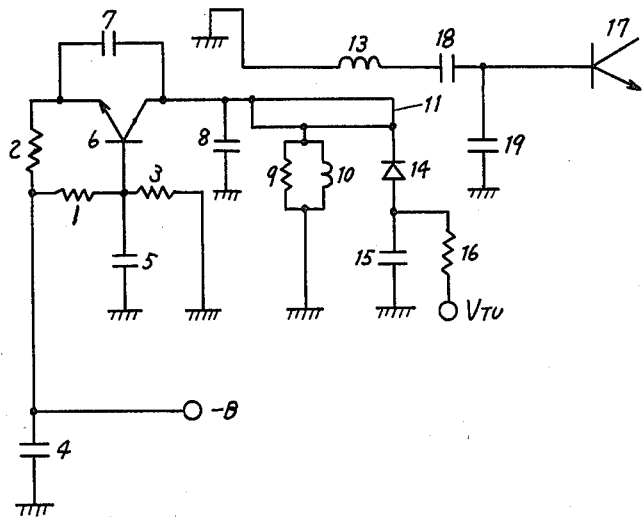
FIG. 1 shows a circuit diagram of local oscillator circuit of the prior art.

At first for better understanding of the invention, the conventional local oscillator circuit will be described briefly with reference to FIG. 1. Numerals 1, 2 and 3 denote the resistances for bias, numerals 4 and 5 the capacitors for grounding, numeral 7 the capacitor for feedback, numeral 8 the capacitor for resonance, numeral 6 the transistor providing the active element for oscillation, numerals 9 and 10 respectively the resistance and choke coil for passing the bias current through the transistor. The collector of transistor 6 is connected in series with an inner conductor 11 and a varicap diode 14, and in parallel to the capacitor 8 so that a local oscillator circuit of common-base configuration which is oscillatory in a wide band is formed. Numeral 15 denotes a capacitor for grounding, and the DC voltage for controlling oscillation is applied through a resistance 16 to the anode of the varicap diode 14.

A pickup coil 13 is adjacent the inner conductor 11, and is inductively coupled to the inner conductor. The pickup coil 13 is adapted to be resonant in the oscillatory band of the local oscillator by capacitors 18 and 19, and to transmit the oscillation energy of the local oscillator to the amplifier 17 of next stage.

Figure 2:
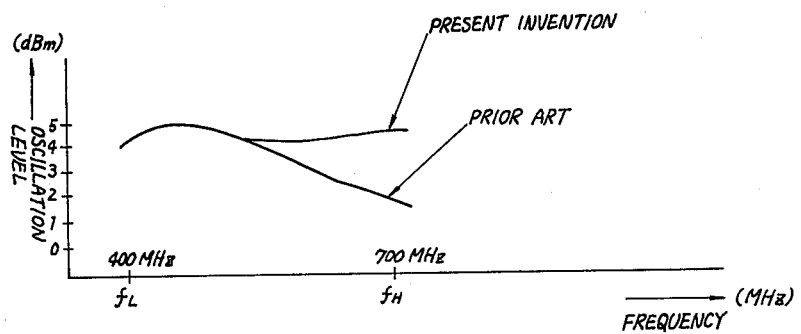
FIG. 2 shows a characteristic diagram for illustrating the pickup characteristic of the local oscillator circuit according to the present invention.

When the above described local oscillation circuit is oscillated in a band of 400–700 MHz, the output level is apt to be lower in the higher frequencies as shown in FIG. 2, presumably because of the frequency characteristic of transistor 6. If the output level is uneven in this manner, the input of the oscillation signals into the next stage, such as a mixer, involves uneven gain of the frequency conversion so that it may be difficult to obtain excellent characteristics for a tuner or the like.

Figure 3:
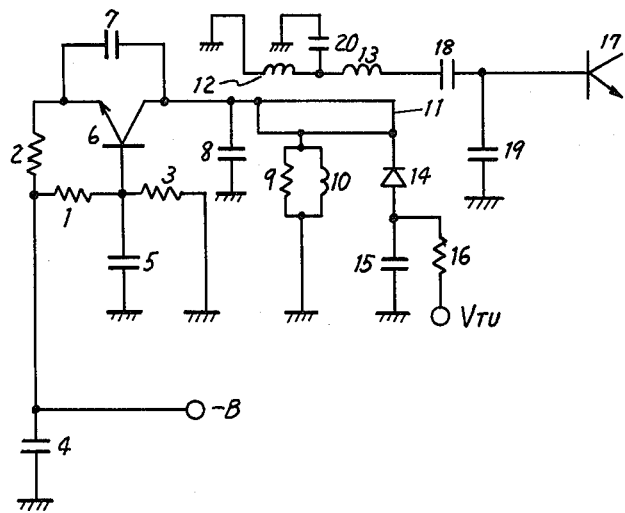
FIG. 3 shows a circuit diagram of the local oscillator circuit according to the present invention.

The present invention will be described with respect to the differences from the conventional example with reference to FIG. 3, wherein elements similar to thos of FIG. 1 are identified with similar numerals.

The pickup coil inductively coupled to the inner conductor 11 is divided so as to provide two coil portions 12 and 13. A capacitor 20 is connected at one end to an intermediate position between coil 12 and coil 13, and is grounded at its other end. The resonance frequency of coil 12 with capacitor 20 is controlled to be more than 700 MHz, which is higher than the oscillation band of the local oscillator. In this case the circuit constants are 6 pF for capacitor 20 and 5–6 nH for the loading coil 12.

In the case where the local oscillator has oscillation frequencies in higher regions, because of a larger current flowing in the resonance circuit of coil 12 with capacitor 20, the magnetic fluxes generated by the current flowing through coil 12 are crosslinked with those of coil 13, and the impedance of the pickup-circuit rises, so that even if the output level of the local oscillator may be lowered, the loss of the pickup-circuit is lessened and so a flat characteristic corrective of the lowering of the oscillation level is achieved as shown in FIG. 2.

As described hereinbefore, the pickup coil is divided and a capacitor is provided between the connection point of the thus bisected coil and ground so that the loss in higher band of the pickup-circuit may be reduced. Accordingly, even if the output level of the local oscillator is lowered in its higher band, said loss is sufficiently compensated to obtain even oscillation output. Further, this can be accomplished by an inexpensive capacitor without requiring expensive transistors which prevents the reduction of oscillation output even in higher band and steady oscillation output level may be achieved quite simply.

I claim:

1. In a local oscillator circuit including:
   a local oscillator having a conductive element receiving oscillating energy from said local oscillator;
   means for receiving oscillating energy from said conductive element, said receiving means including a pickup coil disposed in the vicinity of said conductive element so as to be inductively coupled thereto; and
   a capacitor connected between said pickup coil and ground;
   the improvement wherein said capacitor is connected to a portion of said pickup coil and ground, and the values of said capacitor and said portion of said pickup coil connected to ground therethrough are selected so that said capacitor and said portion of said pickup coil will resonate at frequencies higher than those frequencies in the frequency band generated by said local oscillator.

2. A local oscillator circuit including:

a local oscillator including a conductor receiving oscillating energy from said local oscillator;

means for inductively receiving oscillating energy from said local oscillator, said means including a pickup coil disposed in the vicinity of said conductor so as to be inductively coupled to said conductor, said pickup coil being divided into two portions; and a capacitor connected between the junction of said two portions of said pickup coil and ground and forming with one of said portions of said pickup coil a resonant circuit adapted to resonate at frequencies higher than the frequencies within the band of frequencies generated by said local oscillator.

* * * * *